United States Patent

Dortu et al.

Patent Number: 6,100,733
Date of Patent: Aug. 8, 2000

[54] CLOCK LATENCY COMPENSATION CIRCUIT FOR DDR TIMING

[75] Inventors: Jean-Marc Dortu, S. Burlington; Albert M. Chu, Essex Junction, both of Vt.

[73] Assignees: Siemens Aktiengesellschaft, Munich, Germany; International Business Machines Corporation, Armonk, N.Y.

[21] Appl. No.: 09/093,802

[22] Filed: Jun. 9, 1998

[51] Int. Cl.⁷ .................................................. H03L 7/06
[52] U.S. Cl. .................................................. 327/149; 327/158
[58] Field of Search ...................................... 327/149, 150, 327/158, 159, 161, 153, 243, 244, 245, 250, 165; 375/359; 365/233, 233.5

[56] References Cited

U.S. PATENT DOCUMENTS

| | | | |
|---|---|---|---|
| 4,985,639 | 1/1991 | Renfrow et al. | 327/243 |
| 5,216,302 | 6/1993 | Tanizawa | 327/157 |
| 5,939,912 | 8/1999 | Rehm | 327/158 |
| 5,939,913 | 8/1999 | Tomita | 327/158 |

*Primary Examiner*—Tuan T. Lam
*Attorney, Agent, or Firm*—Stanton C. Braden

[57] ABSTRACT

A clock latency circuit, method and system is provided which allows the synchronization of data according to the rising and falling edges of a system clock.

1 Claim, 2 Drawing Sheets

CLOCK LATENCY COMPENSATION CIRCUIT FOR DDR TIMING

BACKGROUND OF THE INVENTION

It is important that data output transitions associated with an integrated circuit, e.g., a memory (dynamic random access memory (DRAM) or static random access memory (SRAM)), or other timing critical device occur in synchronized fashion with a system clock to the integrated circuit. Lack of data output synchronization with the system clock is often described in terms of clock to data latency.

Latency problems have been addressed in the past through use of a delay locked loop (DLL) which is illustrated in the schematic drawing of FIG. 1. In a DLL, phase comparator 2 controls delay line 4 so that the phase difference between clock signals Ckin and Ckout is zero. The time delay provided by delay line 4 stabilizes when the delay between signals Ckin and Ckout is k*T, where T is the period of clock signal Ckin and k is a natural number. Prior art schemes to eliminate clock to data latency generally work with reference to the rising edge of a clock. Latency problems with respect to the falling edge of a clock are not addressed. Consequently, such schemes are not well suited for double data rate applications such as those concerning double data rate synchronous dynamic random access memories (DDR SDRAMs). A need exists to compensate for clock to data latency pertaining to double data rate applications.

Figure 1:
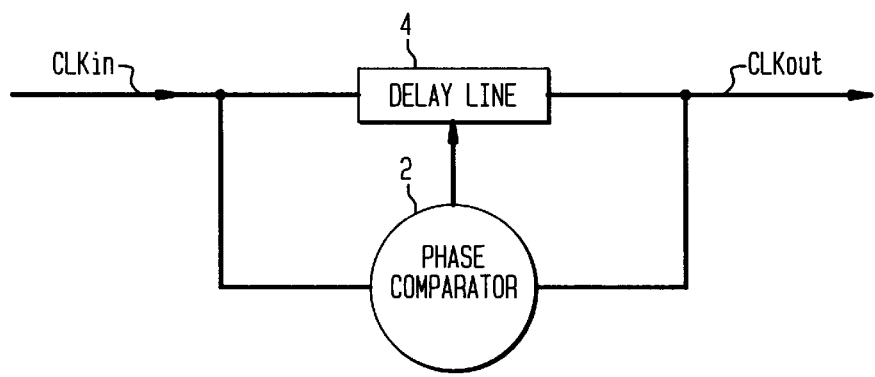
FIG. 1 is a schematic drawing of conventional delay locked loop (DLL).

Reference numerals and symbols have been carried forward.

DETAILED DESCRIPTION OF THE INVENTION

The invention solves the double data rate clock to data latency problem through the implementation of two clocks: one triggered by the rising edge of the system clock and the other triggered by the falling edge of the system clock. The said two generated clocks are phase adjusted through two delay lines with common control.

Figure 2:
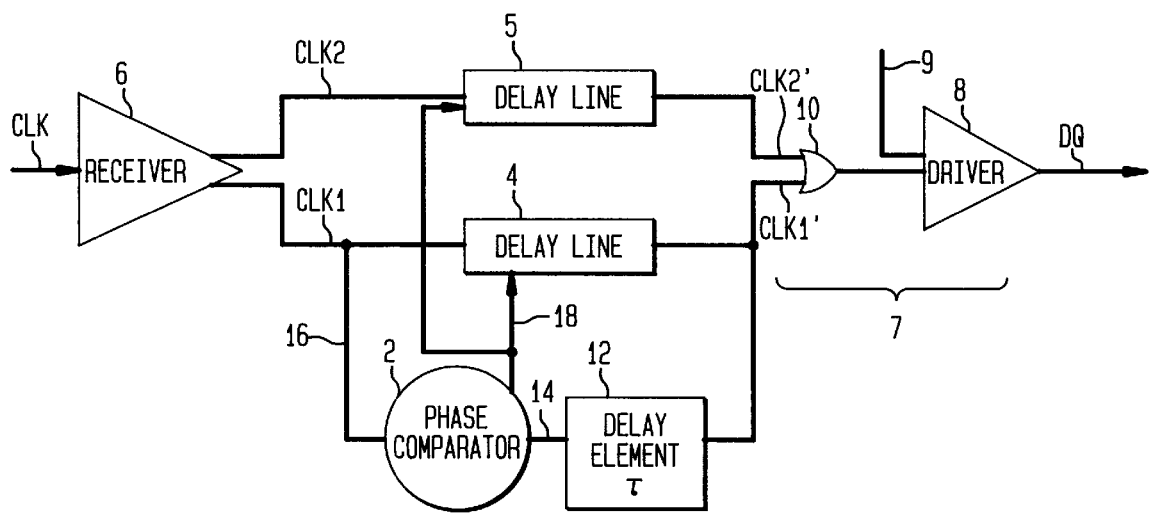
FIG. 2 illustrates a schematic drawing of a preferred embodiment of the invention.

FIG. 2 illustrates a schematic drawing of preferred embodiment of a circuit according to the invention which can be fabricated on an integrated circuit. The circuit in FIG. 2 allows synchronization of data output from an integrated circuit with the rising and falling edges of a system clock input to the integrated circuit. Such a circuit can be ideally used in conjunction with double data rate applications. Receiver 6 receives the system clock signal CLK and produces two clock signals, CLK1 and CLK2 respectively, which are input to the respective delay lines 4 and 5, delay line 4 forms a delay-locked loop (DLL) with phase comparator 2. Delay line 4 can be constructed of active or passive variable impedance circuitry or it can be derived from microcomputer, microcontroller, or digital signal processor. In its preferred embodiment, receiver 6 comprises two conventional monostable multivibrator circuits or one-shot circuits, one of which triggers off of the rising edge of the system clock and the other of which triggers off of the falling edge of the system clock. A monostable multivibrator circuit or one-shot circuit can be implemented as a flip-flop with one stable state. Delay R is the propagation delay associated with receiver 6. Delay D is the propagation delay associated with the driver circuitry 7 comprising driver 8 and OR gate 10. Delay element 12 provides compensation via a DLL loop (which includes a path through elements 2, 4, and 12) through introduction of phase delay τ=R+D in the loop. When the synchronization is reached, the delay of the output signal with respect to the input clock is k*T. So, the delay of the signal entering the driver circuitry 7 with respect to the input clock is k*T−D, where D is the propagation delay of the driver 7. Phase comparator 2 need not output phase compensation causing data to delay lines 4 and 5 when a comparison of the phase input by phase comparator 2 results in the information at input 14 of phase comparator 2 having a delay of k*T relatively to the information at input 16 of phase comparator 2. (R delay at input 16 and tau+ k*T−D=R+D+k*T−D=R+k*T at input 14). Should this relationship not exist, phase comparator 2 causes delay lines 4 to increase or decrease the delay associated with delay line 4 via a control signal from output 18 of phase comparator 2 so as to achieve the above described R delay condition at inputs 14 and 16. The delay lines 4 and 5 output a respective time-shifted version of the clock signal at delay lines 4 and 5s input (e.g., CLK1' being a time-shifted version of CLK1 and CL2' being a time-shifted version of CLK2). Logic involving the ORing of clock signals CLK1' and CLK2' to produce an input to driver 8, which also receives an input from output data 9, yields data signal DQ.

Figure 3:
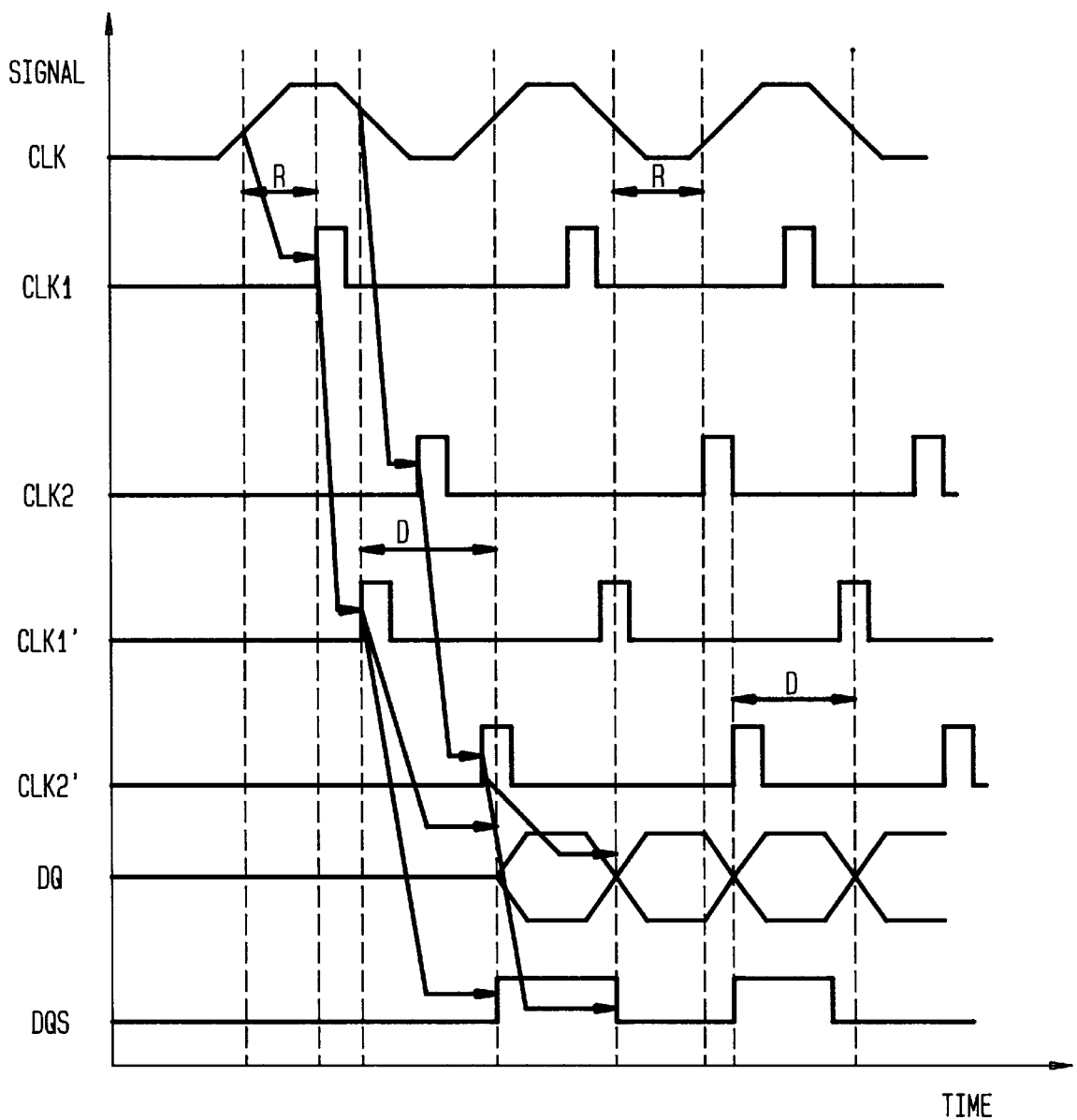
FIG. 3 illustrates a timing diagram showing the operation of the circuit in FIG. 2.

A timing diagram illustrating the operation of the circuit of FIG. 2 is shown in FIG. 3. In the case of illustration 3, the integer k mentioned earlier is assumed to be equal to 1. Since the same control signal from output 18 is used to control delay lines 4 and 5 (and because each delay line 4 and 5 is constructed substantially the same) the delay between clocks signals CLK1 and CLK2 remains constant. Additionally, the pseudo clock duty cycle involving clocks CLK1 and CLK2 (defined as the time from the rising edge of clock CLK1 to the rising edge of clock CLK2 divided by the period of CLK1 or CLK2.) is maintained, by the circuit of FIG. 2, equal to the duty cycle of system clock CLK. The clock duty cycle is defined as the clock signal uptime divided by the clock period. As shown in FIG. 3, clock signal CLK1 is triggered by the rising edge of system clock CLK following a delay of time R while clock signal CLK2 is triggered by the falling edge of system clock CLK. Clock signal CLK1' is triggered in a way that the delay between the rising edge of CLK1' and the following rising edge of the system clock is exactly the delay of the output driver D. As shown by a causation arrow from the CLK1 waveform to the CLK1' waveform, signal CLK1 triggers signal CLK1' following a delay time which is equal to the time delay contributed by delay line 4. Likewise, the causation arrow from clock signal CLK2 to clock signal CLK2' demonstrates that signal CLK2 triggers signal CLK2' following a delay time which is also equal to the time delay contributed by delay line 5. Data signal DQ contains the data output of the application associated therewith, e.g. data from a DRAM. As shown by the causation arrows in FIG. 3, the data transitions on signal DQ are triggered by the rising edges of clock signals CLK1' and CLK2' respectively. The distance between the rising edge of clock CLK1' and clock CLK2' is the same as the distance between the rising edges of clock CLK1 and the rising edge of clock CLK2. Thus, the pseudo clock duty cycle concerning clocks CLK1' and CLK2' (defined as the time from the rising edge of clock CLK1' to the rising edge of clock CLK2' divided by the period of CLK1' or CLK2' is maintained by the circuit of FIG. 2, so as to equal to the clock duty cycle of system clock CLK. Thus, the foregoing invention can be used to synchronize the transmission of output data to the rising edges and the falling edges of the system clock CLK on a given integrated circuit. For instance, the transitions on DQ are synchronized with the rising and falling edges of system clock CLK. The transition timing is clearly demonstrated by data strobe signal DQS which represents the waveform timing transition on signal DQ as caused by signals CLK1' and CLK2'. The production of data strobe signal DQS corresponds to, for instance, when data becomes valid on the integrated circuit pins of DDR SDRAM. Consequently, the DQS signal (one such signal being associated with a plurality of outputs, e.g. 16 outputs) can be used by a controller to locate a data-valid window more accurately and to resynchronize data coming from a plurality of integrated circuits such as dual in-line-memory modules.

Although the invention has been described in detail herein with reference to preferred embodiments and certain described alternatives, it is to be understood that this description is by way of example only, and it is not to be construed in a limiting sense. It is to be further understood that numerous changes in the details of the embodiments of the invention, and additional embodiments of the invention, will be apparent to, and may be made by, persons of ordinary skill in the art having reference to this description. It is contemplated that all such changes and additional embodiments are within the spirit and true scope of the invention as claimed below.

We claim:

1. A clock to data latency compensation circuit which includes a delay locked loop, for a system associated with at least one integrated circuit, comprising:

a receiver, comprising at least one monostable multivibrator circuit, operable to receive a system clock signal and to produce first and second receiver clock signals;

a first delay line, including an input and an output, comprising active impedance circuitry, said first delay line receiving said second receiver clock signal;

a second delay line, including an input and an output, comprising active impedance circuitry, said second delay line receiving said first receiver first clock signal;

a delay element, including an input and an output, which introduces phase delay to said delay locked loop which is operable to receive the output from said second delay line;

a phase comparator operable to compare the phase of said delay element output and said first receiver clock signal, and to produce a control signal to control the delay produced by said first and second delay lines;

a logic gate operable to receive the signals output from said first and second delay lines; and a driver circuit operable to receive ouput from said logic gate to drive output for said clock to data latency compensation circuit.

* * * * *